(12) United States Patent
Shi et al.

(10) Patent No.: US 8,798,349 B2
(45) Date of Patent: Aug. 5, 2014

(54) SYSTEMS AND METHODS FOR DETECTING ARTERIAL INPUT FUNCTION (AIF)

(75) Inventors: Lin Shi, Hong Kong (CN); Defeng Wang, Hong Kong (CN); Pheng Ann Heng, Hong Kong (CN)

(73) Assignee: The Chinese University of Hong Kong, Hong Kong (CN)

( * ) Notice: Subject to any disclaimer, the term of this patent is extended or adjusted under 35 U.S.C. 154(b) by 171 days.

(21) Appl. No.: 13/135,460

(22) Filed: Jul. 5, 2011

(65) Prior Publication Data

US 2013/0011037 A1 Jan. 10, 2013

(51) Int. Cl.
*G06K 9/00* (2006.01)

(52) U.S. Cl.
USPC .......................................................... 382/131

(58) Field of Classification Search
None
See application file for complete search history.

(56) References Cited

PUBLICATIONS

Murase, Kenya, et al. "Determination of arterial input function using fuzzy clustering for quantification of cerebral blood flow with dynamic susceptibility contrast- enhanced MR imaging." Journal of Magnetic Resonance Imaging 13.5 (2001): 797-806.*
Alsop et al., "Defining a Local Input Function for Perfusion Quantification with Bolus Contrast MRI," *Proceedings of the 10th Annual Meeting of the ISMRM*, Honolulu, Hawaii, USA, 2002, 1 page.
Calamante et al., "Quantification of Perfusion Using Bolus Tracking Magnetic Resonance Imaging in Stroke," *Stroke* 33:1146-1151, 2002.
Carroll et al., "Automatic Calculation of the Arterial Input Function for Cerebral Perfusion Imaging with MR Imaging," *Radiology* 227(2):593-600, 2003.
Harisinghani et al., "MRI Contrast Agents for Evaluating Focal Hepatic Lesions," *Clinical Radiology 56*: 714-725, 2001.
Mlynash et al., "Automated Method for Generating the Arterial Input Function on Perfusion-Weighted MR Imaging: Validation in Patients with Stroke," *AJNR* 26:1479-1486, 2005.
Mouridsen et al., "Automatic Selection of Arterial Input Function Using Cluster Analysis," *Magnetic Resonance in Medicine* 55:524-531, 2006.
Nakamura et al., "Tumor-detecting capacity and clinical usefulness of SPIO-MRI in patients with hepatocellular carcinoma," *Journal of Gastroenterology 35*: 849-855, 2000.
Parker et al., "Automated Arterial Input Function Extraction for T1-Weighted DCE-MRI," *Proceedings of the 11th Annual Meeting of ISMRM*, Toronto, Ontario, Canada, 2003, p. 1264.
Rausch et al., "Analysis of input functions from different arterial branches with gamma variate functions and cluster analysis for quantitative blood volume measurements," *Magnetic Resonance Imaging 18*:1235-1243, 2000.
Schellinger et al., "Imaging-Based Decision Making in Thrombolytic Therapy for Ischemic Stroke," *Stroke* 34:575-583, 2003.
Singh et al., "Improved Bolus Arrival Time and Arterial Input Function Estimation for Tracer Kinetic Analysis in DCE-MRI," *Journal of Magnetic Resonance Imaging* 29:166-176, 2009.

(Continued)

*Primary Examiner* — Stephen R Koziol
*Assistant Examiner* — Raphael Schwartz
(74) *Attorney, Agent, or Firm* — Seed IP Law Group PLLC

(57) ABSTRACT

Disclosed are methods, systems and apparatuses for detection of arterial input function (AIF) in MRI, specially DCE MR images, comprising automatic selection of AIF based on affinity propagation (AP) clustering method.

14 Claims, 4 Drawing Sheets
(4 of 4 Drawing Sheet(s) Filed in Color)

(56) References Cited

PUBLICATIONS

Wang et al., "Estimating the Number of Clusters via System Evolution for Cluster Analysis of Gene Expression Data," *IEEE Transactions on Information Technology in Biomedicine* 13(5):848-853, 2009.

Wang et al., "Fast Algorithm of Affinity Propagation Clustering under Given Number of Clusters," *Computer Systems & Applications* 19(5):207-209, 2010.

* cited by examiner

SYSTEMS AND METHODS FOR DETECTING ARTERIAL INPUT FUNCTION (AIF)

TECHNICAL FIELD

The present application relates to the field of magnetic resonance imaging (MRI), particularly methods and systems for detecting a blood flow in a subject with the MRI.

BACKGROUND

Blood flow (BF) maps of a tissue or organ of a subject calculated from magnetic resonance imaging (MRI), especially dynamic contrast enhanced magnetic resonance imaging (DCE-MRI) are widely used to provide useful information about the conditions of the tissue or organ, especially quantification of tissue or organ perfusion. For example, cerebral blood flow (CBF) maps can provide information assisting a medical practitioner in diagnosis of acute stroke and cancer. The determination of accurate BF maps such as CBF maps requires accurate detection of arterial input function (AIF). However, the determination of accurate BF maps such as CBF maps cannot be achieved in real-time. One of the limiting factors is the difficulty in automatically determining the arterial input function (AIF), which is estimated from the signal change in a major artery. Small variation of the AIF may have a huge effect on the resultant BF, mean transit time (MTT), and other crucial parameters [3]. The current manual AIF determination procedures depend on operators' experience and subjective judgments, which is less reproducible. It is desirable that the AIF can be estimated accurately with no user interaction. To achieve this goal, various automatic and semiautomatic procedures have been proposed for AIF determination [3, 14, 15]. Based on the shape features of the concentration time curves, K-means cluster analysis (KCA) has been applied for automatic AIF selection [3]. The drawback of KCA is that the clustering result is unstable and sensitive to initialization.

SUMMARY

In order to provide more reproducible and/or automatic AIF determination procedures, disclosed herein are methods systems and apparatuses of detecting arterial input function (AIF) in dynamic contrast enhanced magnetic resonance imaging (DCE-MRI) of tissue or organ in a subject.

According to an aspect of the invention, there is provided a method of detecting arterial input function (AIF) in dynamic contrast enhanced magnetic resonance imaging arterial input function (AIF) in dynamic contrast enhanced magnetic resonance imaging (DCE-MRI) scans of a tissue or an organ in a subject comprising:

(a) designing a mask to a major region of a scan imaging;
(b) calculating a concentration of intravascular contrast agent Cp(t) by $$Cp(t) = k\Delta R_2^* = -\frac{1}{TE}\ln\frac{S(t)}{S(0)}, \quad (5)$$

wherein t represents time; $\Delta R_2^*$ represents transverse relaxation at time t, S(t) is a signal intensity at time t, S(0) is a pre-injection baseline signal intensity, k is a scaling factor, preferably S(0) is the mean intensity of the time slot that the contrast agent arrives at the tissue;

(c) calculating the area under the concentration curve;

(d) discarding $P_{aus}$ percent of the curves with the smallest area, and $P_{aub}$ percent of the remaining curves with the biggest area;

(e) determining peak values of every pixel in every scan image and excluding $P_{pks}$ percent of a pixel which peak value is smaller than a big peak value of all pixels in the scan;

(f) calculating a dissimilarity value between an AIF and a processed concentration time curve by $$dis_{ij} = \sqrt{(x_i - x_j)(x_i - x_j)'}, \quad (6)$$

and selecting $P_{sim}$ percent of small dissimilarity values, wherein $x_i$ represents the processed concentration time curve and $x_j$ represents the AIF curve;

(g) clustering concentration time curves using a fast-AP clustering algorithm, in which concentration time curves of remaining pixels are considered as input data in the cluster analysis;

(h) selecting additional scans to be processed by above steps (a) to (g);

(i) processing the additional scans by above steps (a) to (g); and (j) calculating final estimate of AIF, which is a mean curve with the lowest first moment based on the selection of the scans.

In an embodiment, the method of the invention further comprises determining a blood flow of the tissue or organ based on the final value of AIF. In a preferable embodiment of the invention, the tissue or organ is selected from the group consisting of brain, kidney, lung, heart, liver, thyroid, pancreas, spleen, intestine, prostate, uterus, ovary, breast, limbs, and eyes, etc.

According to another aspect of the invention, there is provided a system of detecting arterial input function (AIF) in a dynamic contrast enhanced magnetic resonance imaging (DCE-MRI) of a tissue or an organ in a subject comprising:

(a) a first module configured for designing a mask to a major region of the MRI data to remove background voxels;
(b) a second module configured for calculating a concentration of intravascular contrast agent Cp(t) by $$Cp(t) = k\Delta R_2^* = -\frac{1}{TE}\ln\frac{S(t)}{S(0)}, \quad (5)$$

wherein t represents time; $\Delta R_2^*$ represents transverse relaxation at time t, S(t) is a signal intensity at time t, S(0) is a pre-injection baseline signal intensity, k is a scaling factor, preferably S(0) is the mean intensity of the time slot that the contrast agent arrives at the tissue;

(c) a third module configured for calculating an area under the concentration curve so as to discard $P_{aus}$ percent of the curves with the smallest area, and $P_{aub}$ percent of the remaining curves with the biggest area;

(d) a forth module configured for determining peak values of every pixel in every slice image and excluding $P_{pks}$ percent of a pixel which peak value is smaller than a big peak value of all pixels in the slice.

(e) a fifth module configured for calculating a dissimilarity value between an AIF and a processed concentration time curve by $$dis_{ij} = \sqrt{(x_i - x_j)(x_i - x_j)'}, \quad (6)$$

and selecting $P_{sim}$ percent of small dissimilarity values, wherein $x_i$ represents the processed concentration time curve and $x_j$ represents the AIF curve;

(f) a sixth module configured for clustering concentration time curves using a fast-AP clustering algorithm, in which concentration time curves of remaining pixels are considered as input data in the cluster analysis.

In one embodiment of the invention, the system further comprises a seventh module configured for selecting additional scans subjected to the process conducted by the first module to the sixth module.

In further embodiment of the invention, the system further comprises an eighth module configured for calculating a final value of AIF, which is a mean curve with the lowest first moment based on the selected scans.

In still further embodiment, the system of the invention further comprises a ninth module configured for determining a blood flow of the tissue or organ based on the final value of AIF. In a preferable embodiment of the invention, the tissue or organ is selected from the group consisting of brain, kidney, lung, heart, liver, thyroid, pancreas, spleen, intestine, prostate, uterus, ovary, breast, limbs, and eyes, etc.

The above modules included in the system as disclosed herein can be integrated together or used separately.

According to another aspect of the invention, there is provided one or more computer readable media storing computer executable code for instructing one or more processors for detecting arterial input function (AIF) in dynamic contrast enhanced magnetic resonance imaging (DCE-MRI) scans of a tissue or an organ in a subject. In embodiments of the invention, the processors are selected from the group consisting of (a) a processor for designing a mask to a major region of a scan imaging;

(b) a processor for calculating a concentration of intravascular contrast agent Cp(t) by $$Cp(t) = k\Delta R_2^* = -\frac{1}{TE}\ln\frac{S(t)}{S(0)}, \quad (5)$$

wherein t represents time; $\Delta R_2^*$ represents transverse relaxation at time t, S(t) is a signal intensity at time t, S(0) is a pre-injection baseline signal intensity, k is a scaling factor, preferably S(0) is the mean intensity of the time slot that the contrast agent arrives at the tissue;

(c) a processor for calculating the area under the concentration curve;

(d) a processor for discarding $P_{aus}$ percent of the curves with the smallest area, and $P_{aub}$ percent of the remaining curves with the biggest area;

(e) a processor for determining peak values of every pixel in every scan image and excluding $P_{pks}$ percent of a pixel which peak value is smaller than a big peak value of all pixels in the imaging;

(f) a processor for calculating a dissimilarity value between an AIF and a processed concentration time curve by $$dis_{ij} = \sqrt{(x_i - x_j)(x_i - x_j)'}, \quad (6)$$

and selecting $P_{sim}$ percent of small dissimilarity values, wherein $x_i$ represents the processed concentration time curve and $x_j$ represents the AIF curve, (g) a processor for clustering concentration time curves using a fast-AP clustering algorithm, in which concentration time curves of remaining pixels are considered as input data in the cluster analysis, or any combination thereof.

In one embodiment of the invention, one or more computer readable media further store computer executable code for selecting additional scans subjected to the process conducted by processor (a) to processor (g) as described herein. In other embodiment of the invention, one or more computer readable media further store computer executable code for instructing a processor for calculating a final value of AIF, which is a mean curve with the lowest first moment based on the selected scans.

In one embodiment of the invention, one or more computer readable media further store computer executable code for instructing a tenth processor for determining a blood flow of the tissue or organ based on the final value of AIF.

According to another aspect of the invention, there is provided an apparatus of detecting arterial input function (AIF) in a dynamic contrast enhanced magnetic resonance imaging (DCE-MRI) of a tissue or an organ in a subject, comprising a scanner for scanning and obtaining MRI data, a system and/or one or more computer readable media storing computer executable code for instructing one or more processors as disclosed herein.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other features, aspects and advantages of the present disclosure will become better understood with regard to the following description and accompanying drawings wherein:

FIGS. 3A to 3E show the results of $2^{nd}$ to $6^{th}$ slice in the kidney MRI data.

DEFINITIONS

Figure 1:
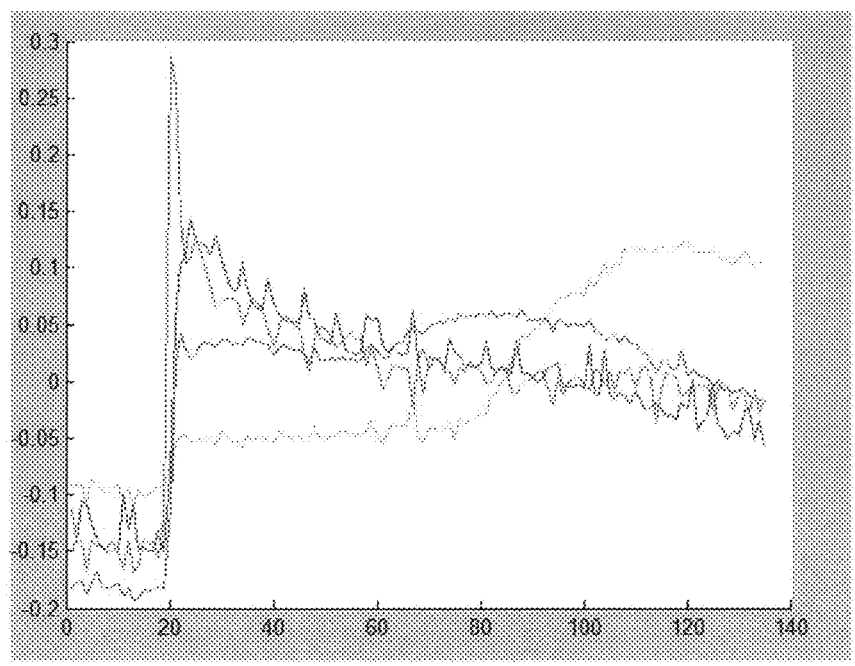
FIG. 1 shows four different kinds of concentration time curves in DCE-MRI.

As used herein, the term "comprising" means "including". Variations of the word "comprising", such as "comprise" and "comprises", have correspondingly varied meanings. Thus, for example, a module "comprising" a unit being used for quantitatively counting may consist exclusively of that unit or may include one or more additional units.

As used herein, the singular form "a", "an" and "the" include plural references unless the context clearly dictates otherwise. In particular, where the indefinite article is used, the specification is to be understood as contemplating plurality as well as singularity, unless the context requires otherwise.

As used herein the term "subject" is not limited to human beings, but is intended to include all vertebrate animals in addition to human beings, which are preferably selected from the group consisting of a monkey, dog, horse, deer, pig, guinea pig, sheep, goat, cattle, buffalo, rabbit, cat, rat and mouse. In the embodiments disclosed herein, where the subject refers to the human being, the terms "patient" and "subject" can be alternately used and refer to any people or any ethnic groups in the world, preferably a patient needed to obtain information about a blood flow in a tissue or organ.

As used herein, the term "about" or "approximately" when used in conjunction with a number refers to any number within 1, 5 or 10% of the referenced number.

Reference throughout this specification to "one embodiment", or "an embodiment", or "in another embodiment", or "some embodiments", or "in certain embodiments" means that a particular referent feature, structure, or characteristic described in connection with the embodiment is included in at least one embodiment. Thus, the appearance of the phrases "in one embodiment", or "in an embodiment", or "in another embodiment", or "in some embodiments" in various places throughout this specification are not necessarily all referring to the same embodiment. Furthermore, the particular features, structures, or characteristics may be combined in any suitable manner in one or more embodiments.

For the purposes of description, all documents referred to herein are incorporated by reference unless otherwise stated.

DETAILED DESCRIPTION

In this application, an automated and robust algorithm for automatic selection of arterial input function (AIF) is provided based on an affinity propagation (AP) clustering method [1]. It is demonstrated that the proposed algorithm can identify the AIF curve and voxels accurately, efficiently, and reliably in the DCE MR images, which shows good applicability in this technical field.

In particular, in the preprocessing steps, the information of area under curve and similar measures to decrease the number of voxels for more balanced clustering are utilized. In addition, instead of classifying within certain scans, clustering on voxels in the majority of scans are applied. It is shown that the AIF determined by the proposed algorithm is reliable and stable.

AP (Affinity Propagation) Algorithm

Affinity propagation algorithm was proposed by Frey et al in 2007 [1]. Different from the traditional K-means clustering, AP provides the method that simultaneously considers all data points as potential exemplars. By viewing each data point as a node in a network, AP recursively transmits real-valued messages along edges of the network until a good set of exemplars and corresponding clusters emerges.

Specifically, AP algorithm takes as input a collection of real valued similarities between data points, where the similarity s(i, k) indicates how well the data point with index k is suited to be the exemplar for data points i. And it takes as input a real number s(k, k) for each data point k so that data point with larger values of s(k, k) are more likely to be chosen as exemplar. These values are referred to as "preferences". The preferences influence the number of identified exemplars. The responsibility r(i, k), sent from data point i to candidate exemplar point k, reflects the accumulated evidence for how well suited point k is to serve as the exemplar for point i taking into account other potential exemplars from point i. The availability a(i, k) reflects the accumulated evidence for how appropriate it would be for feature i to choose feature k as its exemplar, considering the support from other feature vectors that feature k should be an exemplar. They are briefly defined as following:

$$s(i, k) = -\|x_i - x_k\|^2 \quad (1)$$

$$r(i, k) \leftarrow s(i, k) - \max_{k' \neq k} \{a(i, k') + s(i, k')\} \quad (2)$$

$$a(i, k) \leftarrow \min\left\{0, r(k, k) + \sum_{i' \notin \{i', k\}} \{0, r(i', k)\}\right\} \quad (3)$$

For k=i, the responsibility r(k, k) is set to the input preference that point k is chosen as an exemplar. If r(k, k) is negative, the self availability a(k, k) is updated differently:

$$a(k, k) \leftarrow \sum_{i' \, s.t., i' \neq k} \max\{0, r(i', k)\} \quad (4)$$

This message reflects accumulated evidence that point k is an exemplar, based on the positive responsibilities sent to candidate exemplar k from other points.

In contrast to K-means clustering, AP algorithm does not require the user to assign the precise cluster number. But in the AIF selection problem, it is necessary to cluster the data points to a certain number clusters. In Wang' article [2], the improved AP method called "fast multi-grid searching method (fast-AP algorithm)" provides a good solution. The major improvements in the fast-AP algorithm are as follow: multi-grid searching stages are built initially. Basing on different number of clusters, different preferences are built. Meanwhile, there is an improved upper bound on the preferences value.

Automatic AIF Extraction

The methods, systems or apparatuses in the present invention for automatic extraction of AIF are based on the shape of the concentration time curves. An ideal AIF curve is defined as a curve with a high amplitude, early sharp rise, fast decay, and small full width at half maximum [11]. In FIG. 1, four kinds of curves are shown. Before clustering, the pre-treatment procedure is employed aiming at decreasing the number of voxels in DCE-MRI.

According to an aspect of the invention, there is provided a method of detecting arterial input function (AIF) in dynamic contrast enhanced magnetic resonance imaging (DCE-MRI) scans of a tissue or an organ in a subject comprising:

(a) designing a mask to a major region of a scan imaging to remove background voxels;

(b) calculating a concentration of intravascular contrast agent Cp (t) by $$Cp(t) = k\Delta R_2^* = -\frac{1}{TE}\ln\frac{S(t)}{S(0)}, \quad (5)$$

wherein t represents time; $\Delta R_2^*$ represents transverse relaxation at time t, S(t) is a signal intensity at time t, S(0) is a pre-injection baseline signal intensity, k is a scaling factor, preferably S(0) is the mean intensity of the time slot that the contrast agent arrives at the tissue;

(c) calculating the area under the concentration curve;

(d) discarding $P_{aus}$ percent of the curves with the smallest area, and $P_{aub}$ percent of the remaining curves with the biggest area;

(e) determining peak values of every pixel in every scan image and excluding $P_{pks}$ of a pixel which peak value is smaller than a big peak value of all pixels in the scan;

(f) calculating a dissimilarity value between an AIF and a processed concentration time curve by $$dis_{ij} = \sqrt{(x_i - x_j)(x_i - x_j)'}, \quad (6)$$

and selecting $P_{sim}$ percent of small dissimilarity values, wherein $x_i$ represents the processed concentration time curve and $x_j$ represents the AIF curve (g) clustering concentration time curves using a fast-AP clustering algorithm, in which concentration time curves of remaining pixels are considered as input data in the cluster analysis;

(h) selecting additional scans to be processed by above steps (a) to (g);

(i) processing the additional scans by above steps (a) to (g); and (j) calculating a final estimate of AIF, which is a mean curve with the lowest first moment based on the selection of the scans.

In an embodiment, the method of the invention further comprises determining a blood flow of the tissue or organ based on the final value of AIF. In a preferable embodiment of the invention, the tissue or organ is selected from the group consisting of brain, kidney, lung, heart, liver, thyroid, pancreas, spleen, intestine, prostate, uterus, ovary, breast, limbs, and eyes, etc.

According to another aspect of the invention, there is provided a system of detecting arterial input function (AIF) in a dynamic contrast enhanced magnetic resonance imaging (DCE-MRI) of a tissue or an organ in a subject comprising:

(a) a first module configured for designing a mask to a major region of a scan imaging MRI data to remove the large amount of background voxels;

(b) a second module configured for calculating a concentration of intravascular contrast agent Cp(t) by $$Cp(t) = k\Delta R_2^* = -\frac{1}{TE}\ln\frac{S(t)}{S(0)}, \quad (5)$$

wherein t represents time; $\Delta R_2^*$ represents transverse relaxation at time t, S(t) is a signal intensity at time t, S(0) is a pre-injection baseline signal intensity, k is a scaling factor, preferably S(0) is the mean intensity of the time slot that the contrast agent arrives at the tissue;

(c) a third module configured for calculating an area under the concentration curve so as to discard $P_{aus}$ percent of the curves with the smallest area, and $P_{aub}$ percent of the remaining curves with the biggest area;

(d) a forth module configured for determining peak values of every pixel in every scan imaging and excluding $P_{pks}$ percent of a pixel which peak value is smaller than a big peak value of all pixels in the scan.

(e) a fifth module configured for calculating a dissimilarity value between an AIF and a processed concentration time curve by $$dis_{ij} = \sqrt{(x_i - x_j)(x_i - x_j)'}, \quad (6)$$

and selecting $P_{sim}$ percent of small dissimilarity values, wherein $x_i$ represents the processed concentration time curve and $x_j$ represents the AIF curve.

(f) a sixth module configured for clustering concentration time curves using a fast-AP clustering algorithm, in which concentration time curves of remaining pixels are considered as input data in the cluster analysis.

In one embodiment of the invention, the system further comprises a seventh module configured for selecting additional scans subjected to the process conducted by the first module to the sixth module.

In further embodiments of the invention, the system further comprises an eighth module configured for calculating a final value of AIF, which is a mean curve with the lowest first moment based on the selected scans.

In still further embodiments, the system of the invention further comprises a ninth module configured for determining a blood flow of the tissue or organ based on the final value of AIF. In a preferable embodiment of the invention, the tissue or organ is selected from the group consisting of brain, kidney, lung, heart, liver, thyroid, pancreas, spleen, intestine, prostate, uterus, ovary, breast, limbs, and eyes, etc.

According to another aspect of the invention, there is provided one or more computer readable media storing computer executable code for instructing one or more processors for detecting arterial input function (AIF) in dynamic contrast enhanced magnetic resonance imaging (DCE-MRI) scans of a tissue or an organ in a subject. In embodiments of the invention, the processors are selected from the group consisting of (a) a processor for designing a mask to a major region of a scan imaging;

(b) a processor for calculating a concentration of intravascular contrast agent Cp(t) by $$Cp(t) = k\Delta R_2^* = -\frac{1}{TE}\ln\frac{S(t)}{S(0)}, \quad (5)$$

wherein t represents time; $\Delta R_2^*$ represents transverse relaxation at time t, S(t) is a signal intensity at time t, S(0) is a pre-injection baseline signal intensity, k is a scaling factor, preferably S(0) is the mean intensity of the time slot that the contrast agent arrives at the tissue;

(c) a processor for calculating the area under the concentration curve;

(d) a processor for discarding $P_{aus}$ percent of the curves with the smallest area, and $P_{aub}$ percent of the remaining curves with the biggest area;

(e) a processor for determining peak values of every pixel in every scan image and excluding $P_{pks}$ percent of a pixel which peak value is smaller than a big peak value of all pixels in the imaging;

(f) a processor for calculating a dissimilarity value between an AIF and a processed concentration time curve by $$dis_{ij} = \sqrt{(x_i - x_j)(x_i - x_j)'}, \quad (6)$$

and selecting $P_{sim}$ percent of small dissimilarity values, wherein $x_i$ represents the processed concentration time curve and $x_j$ represents the AIF curve, (g) a processor for clustering concentration time curves using a fast-AP clustering algorithm, in which concentration time curves of remaining pixels are considered as input data in the cluster analysis, or any combination thereof.

In one embodiment of the invention, one or more computer readable media further stores computer executable code for selecting additional scans subjected to the process conducted by the above processor (a) to processor (g). In another embodiment of the invention, one or more computer readable media further store computer executable code for instructing a processor for calculating a final value of AIF, which is a mean curve with the lowest first moment based on the selected scans.

In one embodiment of the invention, one or more computer readable media further store computer executable code for instructing a tenth processor for determining a blood flow of the tissue or organ based on the final value of AIF.

According to another aspect of the invention, there is provided an apparatus of detecting arterial input function (AIF) in a dynamic contrast enhanced magnetic resonance imaging (DCE-MRI) of a tissue or an organ in a subject, comprising a scanner for scanning and obtaining MRI data, a system or one or more computer readable media storing computer executable code for instructing one or more processors as disclosed herein.

In particular embodiments, the methodology or system, or apparatus to automatically select arterial input function (AIF) comprises the following aspects.

(1) Design the Mask to the Major Region of the MRI Data.

In the MRI data, only the tissue regions need to be considered. Therefore, in an embodiment of the invention, the first module is configured to adopt a simple thresholding to remove the large amount of background voxels. In a preferable embodiment, the threshold is set as in the range of 50 to 150, more preferably 80-120, and most preferably 90 to 110, such as 90, 95, 100, 105 and 110.

(2) Calculate the Concentration of Intravascular Contrast Agent Cp(t)

In an embodiment of the invention, the time change of a signal intensity is converted to Cp(t) at each pixel where t represents time. Assuming a linear relationship between the concentration of a contrast agent in the tissue voxel and the change in transverse relaxation ($\Delta R_2^*$) at time t, a concentration time curve is characterized as follows:

$$Cp(t) = k\Delta R_2^* = -\frac{1}{TE}\ln\frac{S(t)}{S(0)}, \quad (5)$$

where S(t) is the signal intensity at time t, S(0) is the pre-injection baseline signal intensity, and k is the scaling factor. In a set of concentration time curves, only a small set of curves represents the arterial. Preferably, S(0) is the mean intensity of the time slot that the contrast agent arrives at the tissue. The arrival time of the contrast agent is automatically determined through computing the peak of every scan.

(3) Calculate the Area Under the Concentration Curve

In an embodiment of the invention, the areas under the time concentration curves are calculated. Based on the knowledge of the calculated areas, the $P_{aus}$ percent of the curves with the smallest area were discarded, and the $P_{aub}$ percent of the remaining curves with the biggest area were excluded.

(4) Find the Peak Values of Every Pixel in Every Slice Image.

In a further embodiment, peak values of every pixel in every scan image is determined, and then a pixel of $P_{pks}$ percent, which peak value is smaller than the big peak value of all the pixel in the slice, is excluded. Therefore, processed concentration time curves (CTCs) can be obtained.

(5) Calculate the Similarity Value Between the AIF and the Processed Concentration Time Curves.

In the known premise of the approximate shape of AIF curve, the similarity values are computed between the AIF curve and the processed concentration time curves (CTCs). Then the $P_{sim}$ percent of the small dissimilarity values are selected. The dissimilarity value is calculated as follows:

$$dis_{ij} = \sqrt{(x_i - x_j)(x_i - x_j)'}, \quad (6)$$

wherein $x_i$ represents the processed concentration time curve, and $x_j$ represents the AIF curve.

(6) Apply the Cluster Analysis

In an embodiment of the invention, cluster analysis of the concentration time curves is conducted based on a fast-AP algorithm. In a preferable embodiment, the concentration time curves of the remaining pixels are considered as the input data of the cluster analysis. Based on the common shape features, the curves could be divided into K groups. Different from the K-means cluster analysis, the fast-AP clustering algorithm considers all data points as potential exemplars. The cluster results are not sensitive to the initial selection of the exemplars, and stable by many times classifications. The fast-AP algorithm can automatically determine the most appropriate number of clusters according to the data points, and the computation is faster than original AR (7) Selection of Slices to be Processed In an embodiment of the invention, the at least 2, 3, 4, 5, 6, 7 slices or scans in the MRI data are processed. For example, for the tissue or organ MRI, 2, 3, 4, 5, 6, 7 or more slices or scans are selected. Accordingly, a more accurate AIF mean curve is obtained rather than for a certain scan. For different MRI data, the number of scans or slices processed is determined by the user according to the specific scope of the MRI data.

(8) The Final Estimate of AIF

The final AIF estimate is the mean curve with the lowest first moment.

(9) MRI Contrast Agents

In the embodiments of the invention, MRI contrast agents used in the MRI are a group of contrast media used to improve the visibility of internal body structures in magnetic resonance imaging (MRI). The most commonly used compounds for contrast enhancement are gadolinium-based which are chelated metals delivered through the blood stream. For example, the Gadolinium contrast MRI contrast agents can be selected from the group consisting of gadobutrol (Gadavist in the USA, Gadovist in Canada and Europe), gadocoletic acid, gadodenterate, gadomelitol, gadopenamide, gadoteric acid (Dotarem), as well as gadodiamide (Omniscan), gadobenic acid (Multihance), gadopentetic acid (Magnevist), gadoteridol (Prohance), gadofosveset (Ablavar), gadoversetamide (OptiMARK), and gadoxetic acid (Eovist in the USA, Primovist in other parts of the world)[16, 17, 18]. Other chelated metals used in the invention can be iron oxide or manganese chelates. MRI contrast agents alter the relaxation times of tissues and body cavities where they are present. Depending on the image weighting, this can give a higher or lower signal. MRI contrast agents delivered through the blood stream are chelated metals.

EXAMPLES

Materials and Methods

The dynamic contrast enhanced MRI examination was performed in coronal plane using a 3 T clinical whole-body imaging system (Achieva, Philips Healthcare, Best, The Netherlands). After anesthesia, rats were positioned supine and a human wrist coil was used for data acquisition. The contrast-enhanced examinations were acquired with the following parameters: 3D gradient echo sequence, TR/TE/flip angle=6.8 ms/2.3 ms/35°, field of view=80 mm×80 mm×12 mm, the acquisition voxel size was 0.61 mm×0.75 mm×3.00 mm and the reconstructed voxel size was 0.31 mm×0.31 mm×1.5 mm. MRI contrast agent was Gd-DOTA (Guerbet Group, Roissy CDG cedex, France). A dose of 0.075 mmol/kg was hand-injected as a rapid bolus in less than 1 sec after initial baseline 10 acquisitions as quick bolus and followed by a flush of 0.5 ml normal saline. Dynamic scan was stopped when the contrast agent was excreted and clearly visible in the bilateral ureters.

Figure 2:
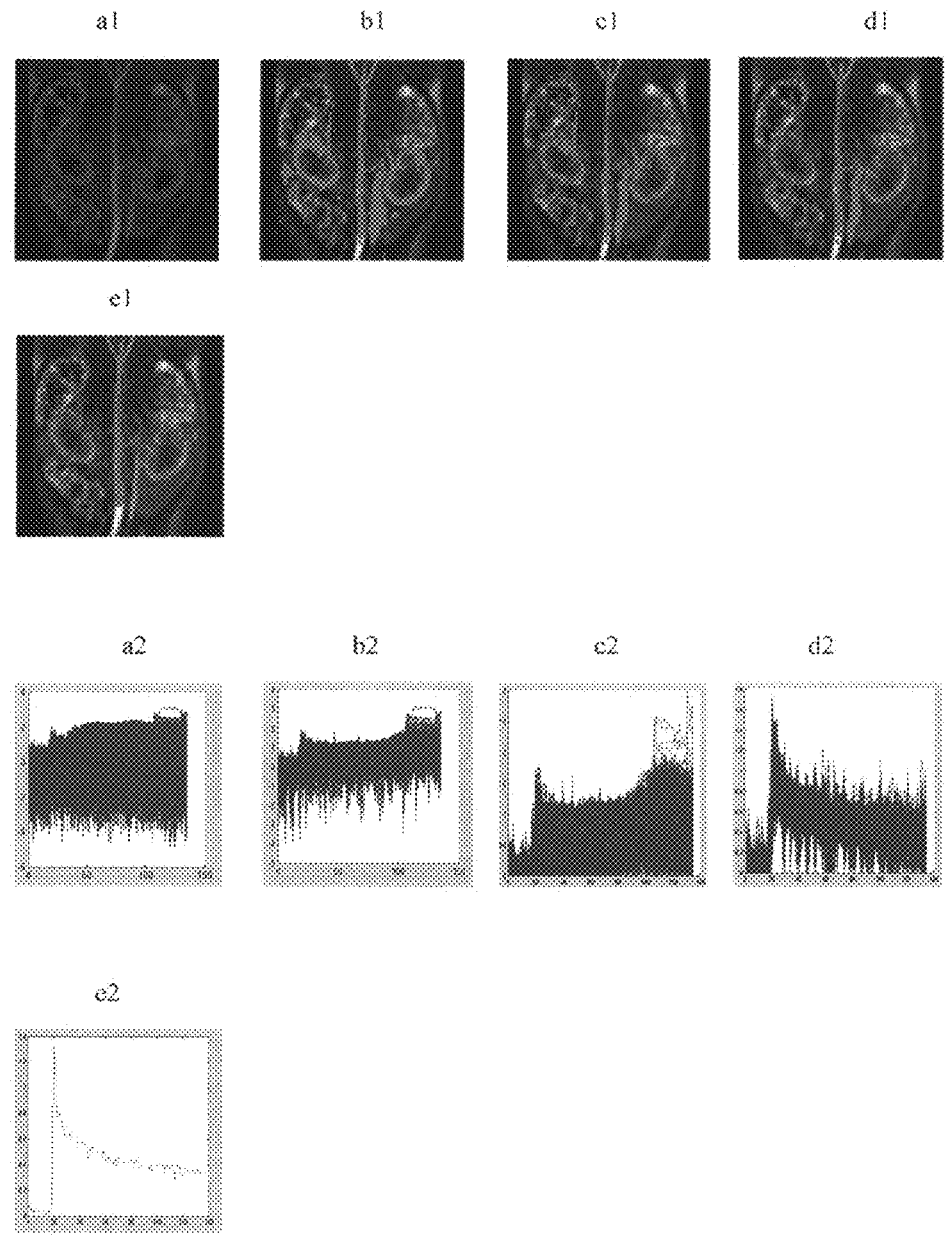
FIG. 2 shows the intermediate results of each processing step on $3^{rd}$ slice of one of the test datasets.

Two MRI datasets of the rat kidney DCE-MRI were obtained. $2^{nd}$ to $6^{th}$ slices were picked up for analysis. FIG. 2 shows the intermediate results of each processing step on $3^{rd}$ slice of one of the test datasets.

Before clustering, the pre-treatment procedure was employed aiming at decreasing the number of voxels in DCE-MRI.

First, a simple thresholding was adopted to remove the large amount of background voxels. In the implementation, the threshold is designated as 100.

Then, the time change of the signal intensity was converted to the concentration of intravascular contrast agent Cp(t) at each pixel:

$$Cp(t) = k\Delta R_2^* = -\frac{1}{TE}\ln\frac{S(t)}{S(0)}, \quad (5)$$

In the set of concentration time curves, only a small set of curves represented the arterial. S(0) was the mean intensity of the time slot that the contrast agent arrives at the tissue. The arrival time was determined automatically through computing the peak of every slice.

Based on the calculated results of an area under the concentration curve, the $P_{aus}$ percent of the curves with the smallest area was discarded, and the $P_{aub}$ percent of the remaining curves with the biggest area was excluded. The peak values of every pixel in every slice image were further determined and then each $P_{pks}$ percent pixel, which peak value was smaller than the big peak value of all the pixels in the slice, were excluded. Therefore, the processed concentration time curves (CTCs) were obtained.

In the known premise of the approximate shape of AIF curves, the similarity values were computed between the AIF curve and the processed concentration time curves (CTCs). Then the $P_{sim}$ percent of the small dissimilarity values were selected. The dissimilarity value is calculated as follows:

$$dis_{ij} = \sqrt{(x_i - x_j)(x_i - x_j)'}, \quad (6)$$

Finally, the fast-AP algorithm was applied to clustering the concentration time curves of the remaining pixels.

The concentration time curves of the remaining pixels were considered as the input data of the cluster analysis.

In the experiment, the $2^{nd}$ to the $6^{th}$ slices of the kidney MRI were selected. The final AIF estimate was the mean curve with the lowest first moment.

Results

The proposed method was applied on two MRI datasets of the rat kidney DCE-MRI. FIG. 2 shows the intermediate results of each processing step on the $3^{rd}$ slice of one of the test datasets. In particular, FIG. 2(a1) is the result after masking out the background voxels, and FIG. 2(a2) shows the concentration curves of all remaining voxels. According to the area under the time curve, most of the non-AIF curves (as shown in FIG. 2(b1)) can be excluded. The remaining curves shown in FIG. 2(b2). FIGS. 2(c1) and 2(d1) show the results after excluding $P_{aub}$, $P_{aus}$, and $P_{pks}$ and selecting $P_{sim}$, respectively. The values of parameters were set as follow:

$$P_{aub} = 0.85, P_{aus} = 0.30, P_{pks} = 0.2, \text{and } P_{sim} = 0.5.$$

After preprocessing, a fast-AP algorithm was used to classify the time curves. The set of curves in FIG. 2(d2) is partitioned into 4 clusters. The final estimate of AIF was the mean curve with the lowest first moment, as shown in FIG. 2(e2), and the automatically detected location of arterial region was shown in FIG. 2(e1).

Figure 3:
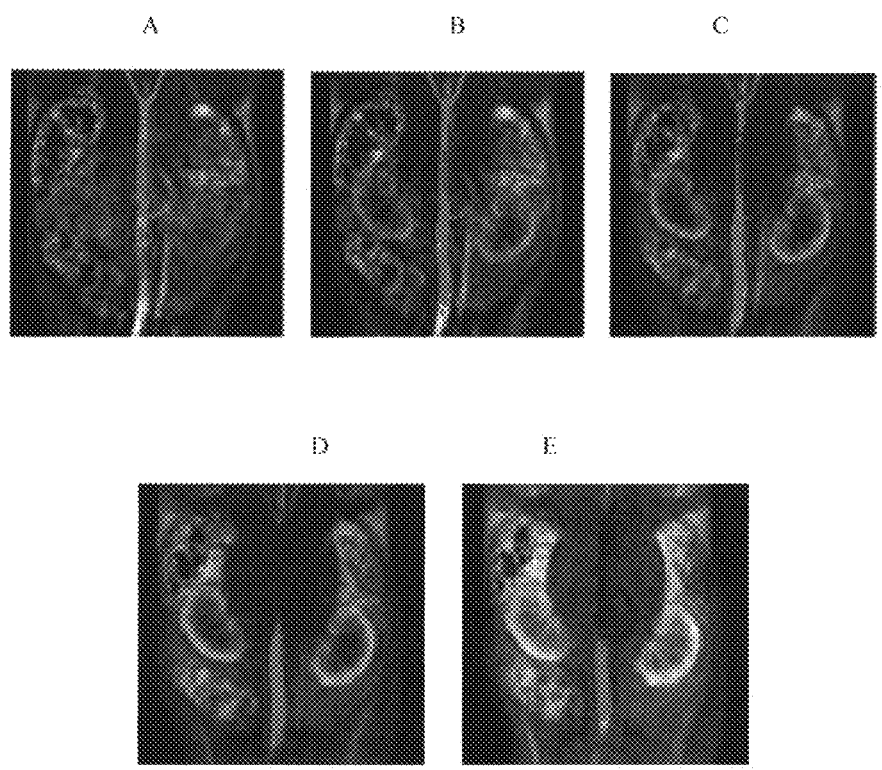
FIG. 3 shows the detected arterial regions.
Figure 4:
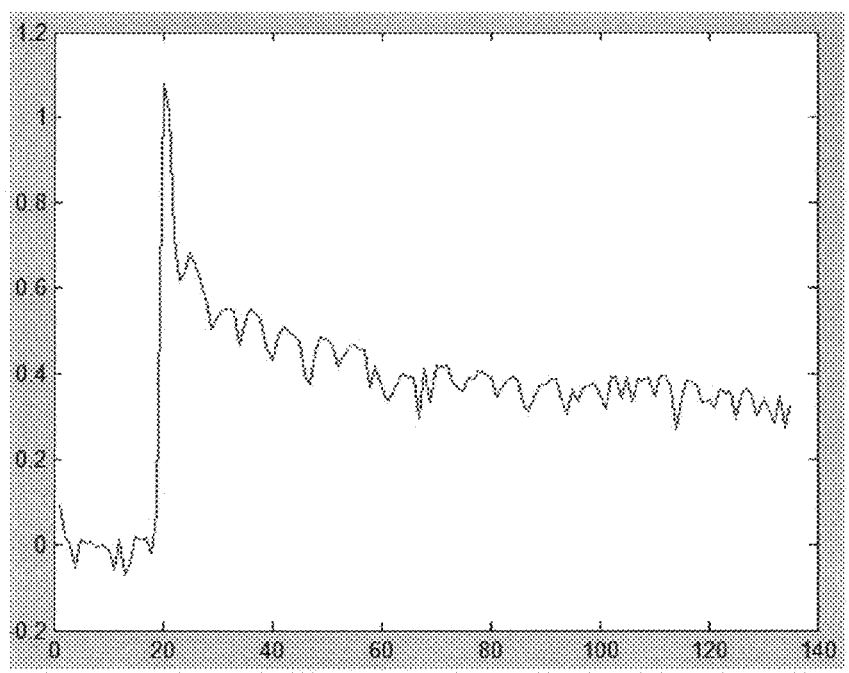
FIG. 4 shows the estimated AIF, i.e., the mean curve of concentration time curves at the arterial pixels in FIG. 3.

For the sake of estimating more accurate AIF curves, instead of at a certain slice, the slices 2nd to 6th have all been processed. FIG. 3 shows the detected arterial regions. In particular, FIGS. 3A to 3E show the results of 2nd to 6th slice in the kidney MRI data. The final AIF curve is shown in FIG. 4, i.e., the mean curve of concentration time curves at the arterial pixels in FIG. 3.

Conclusion

Using an advanced cluster analysis algorithm, an automated and robust algorithm to determining arterial input function for the MRI data was developed. It was demonstrated that the automatic algorithm can estimate the AIF curve and detect the arterial voxels accurately and reliably for the MRI data, especially DCE-MRI data.

All of the above patent and non-patent publications referred to in this specification are incorporated herein by reference, in their entirety.

It will be understood that numerous modifications thereto will appear to those skilled in the art. Accordingly, the above description and accompanying drawings should be taken as illustrative of the invention and not in a limiting sense. It will further be understood that it is intended to cover any variations, uses, or adaptations of the invention following, in general, the principles of the invention and including such departures from the present disclosure as come within known or customary practice within the art to which the invention pertains and as may be applied to the essential features herein before set forth, and as follows in the scope of the appended claims.

REFERENCES

All of the following references are incorporated herein in their entirety.

[1] Calamante F, Gadian D G, Connelly A. Quantification of perfusion using bolus tracking magnetic resonance imaging in stroke: assumptions, limitations, and potential implications for clinical use. Stroke 2002; 331146-1151.

[2] Schellinger P D, Fiebach J B, Hacke W. Imaging based decision making in thrombolytic therapy for ischemic stroke: present status. Stroke 2003; 34:575-583;

[3] Kim Mouridsen, Soren Christensen, Louise Gyldensted and Leif Ostergaard. Automatic Selection of Arterial Input Function Using Cluster Analysis. Magnetic Resonance in Medicine 55: 524-531

[4] Calamante F, Gadian D G, Connelly A. Quantification of perfusion using volus tracking magnetic resonance imaging in stroke: assumptions, limitations, and potential implications for clinical use. Stroke 2002; 331146-1151

[5] Alsop D D, Wedmid A, Schlaug G, Defining a local input function for perfusion quantification with bolus contrast MRI. In: Proceedings of the $10^{th}$ Annual Meeting of the ISMRM, Honolulu, Hi., USA, 2002.

[6] Carroll T J, Rowley H A, Haughton V M. Automatic calculation of the arterial input function for cerebral perfusion image with MR imaging. Radiology 2003; 227:593-600.

[7] Rausch M, Scheffler K, Rudin M, Radu E W. Analysis of input functions from different arterial branches with gamma variety functions and cluster and cluster analysis for quantitative blood volume measurements. Magnetic Resonance Imaging 2000; 28:1235-1243

[8] Mlynash M, Eyngorn I, Bammer R, Moseley M, Tong D C. Automated method for generating the arterial input function on perfusion weighted MR imaging: validation in patients with stroke. American Journal of Neuroradiology 2005; 26:1469-1486

[9] Christensen S, wWu O, Mouridsen K, Fiehler J, Rother J, Ostergaard L. Semi-automated PWI analysis using vascular territory specific local arterial input functions. ISMRM Workshop on Quantitative Cerebral Perfusion Imaging Using MRI, Venice, Italy, 2004.

[10] Kai Jun Wang, Jie Zheng. Fast Algorithm of Affinity Propagation Clustering under Given Number of Clusters

[11] Kai Jun Wang, Jie Zheng, Jun ying Zhang, Ji yang Dong: Estimating the number of clusters via system evolution for cluster analysis of gene expression data. IEEE Transactions on Information Technology in Biomedicine 13(5): 848-853(2009).

[12] Michael Mlynash, Irina Eyngorn, Roland Bammer, Michael Moseley, and David C. Tong, Automated method for generating the arterial input function on perfusion weighted MR imaging: validation in patients with stroke. AJNR Am J Neuroradiol 26:1479-1486, June/July 2005;

[13] Alsop D D, Wedmid A, Schlaug G Defining a local input function for perfusion quantification with bolus contrast MRI. In: Proceedings of the $10^{th}$ Annual Meeting of the ISMRM, Honolulu, Hi., USA, 2002.

[14] Anup Singh, Ram K. Singh Rathore, Mohammad Haris. Improved bolus arrival time and arterial input function estimation for tracer kinetic analysis in DCE-MRI. Journal of Magnetic Resonance Imaging 29: 166-176 (2009)

[15] Parker G J, Jackson A, Waterton J C, Buckley D L. Automated arterial input function extraction for T1-weighted DCE-MRI. In: Proc Annual Meeting of ISMRM, Toronto, 2003; Abstract 1264.

[16] Information on Gadolinium-Containing Contrast Agents.

[17] Nakamural, Naoki; Kotake, Fumio (2000), Tumor-detecting capacity and clinical usefulness of SPIO-MRI in patients with hepatocellular carcinoma, 35, Journal of Gastroenterology.

[18] Harisinghani, Mukesh G; Weissleder, Ralph; Schima, Wolfgang; Saini, Sanjay; Hahn, Peter F.; Mueller, Peter R. (2001), MRI Contrast Agents for Evaluating Focal Hepatic Lesions, 56, Clinical Radiology, pp. 714-725.

The invention claimed is:

1. A method of detecting arterial input function (AIF) in dynamic contrast enhanced magnetic resonance imaging (DCE-MRI) scans of a tissue or an organ in a subject, comprising:
 (a) designing a mask to a major region of a scan imaging;
 (b) calculating a concentration of intravascular contrast agent Cp (t) by $$Cp(t) = k\Delta R_2^* = -\frac{1}{TE}\ln\frac{S(t)}{S(0)},$$

wherein t represents time; $\Delta R_2$ * represents transverse relaxation at time t, S (t) is a signal intensity at time t, S (0) is a pre-injection baseline signal intensity, k is a scaling factor, wherein S (0) is the mean intensity of the time slot that the contrast agent arrives at the tissue;
 (c) calculating the area under the concentration curve;
 (d) discarding $P_{aus}$ percent of the curves with the smallest area, and $P_{aub}$ percent of the remaining curves with the biggest area;
 (e) determining peak values of every pixel in every scan imaging and excluding $P_{pks}$ percent of a pixel which peak value is smaller than a big peak value of all pixels in the scan;
 (f) calculating a dissimilarity value between an AIF and a processed concentration time curve by $$dis_{ij} = \sqrt{(x_i - x_j)(x_i - x_j)'},$$

and selecting $P_{sim}$ percent of small dissimilarity values, wherein $x_i$ represents the processed concentration time curve and $x_j$ represents the AIF curve;
 (g) clustering concentration time curves using a fast-AP clustering algorithm, in which concentration time curves of remaining pixels are simultaneously considered as input data in the cluster analysis;
 (h) selecting additional scans to be processed by above steps (a) to (g);
 (i) processing the additional scans by above steps (a) to (g); and
 (j) calculating a final estimate of AIF, which is a mean curve with the lowest first moment based on the selection of the scans.

2. The method according to claim 1 further comprising determining a blood flow of the tissue or organ based on the final value of AIF.

3. The method according to claim 1, wherein the tissue or organ is selected from the group consisting of brain, kidney, lung, heart, liver, thyroid, pancreas, spleen, intestine, prostate, uterus, ovary, breast, limbs, and eyes.

4. A system of detecting arterial input function (AIF) in a dynamic contrast enhanced magnetic resonance imaging (DCE-MRI) of a tissue or an organ in a subject, comprising:
 (a) a first module configured for designing a mask to a major region of a scan imaging;
 (b) a second module configured for calculating a concentration of intravascular contrast agent Cp (t) by $$Cp(t) = k\Delta R_2^* = -\frac{1}{TE}\ln\frac{S(t)}{S(0)},$$

wherein t represents time; $\Delta R_2$ * represents transverse relaxation at time t, S (t) is a signal intensity at time t, S (0) is a pre-injection baseline signal intensity, k is a scaling factor, wherein S (0) is the mean intensity of the time slot that the contrast agent arrives at the tissue;
 (c) a third module configured for calculating an area under the concentration curve so as to discard $P_{aus}$ percent of the curves with the smallest area, and $P_{aub}$ percent of the remaining curves with the biggest area;
 (d) a fourth module configured for determining peak values of every pixel in every slice image and excluding $P_{pks}$ percent of a pixel which peak value is smaller than a big peak value of all pixels in the slice;
 (e) a fifth module configured for calculating a dissimilarity value between an AIF and a processed concentration time curve by $$dis_{ij} = \sqrt{(x_i - x_j)(x_i - x_j)'},$$

and selecting $P_{sim}$ percent of small dissimilarity values, wherein $x_i$ represents the processed concentration time curve and $x_j$ represents the AIF curve.
 (f) a sixth module configured for clustering concentration time curves using a fast-AP clustering algorithm, in which concentration time curves of remaining pixels are simultaneously considered as input data in the cluster analysis.

5. The system according to claim 4 further comprising a seventh module configured for selecting additional scans subjected to the process conducted by the first module to the sixth module.

6. The system according to claim 4 further comprising an eighth module configured for calculating a final value of AIF, which is a mean curve with the lowest first moment based on the selected scans.

7. The system according to claim 4 further comprising a ninth module configured for determining a blood flow of the tissue or organ based on the final value of AIF.

8. The system according to claim 4, wherein the tissue or organ is selected from the group consisting of brain, kidney, lung, heart, liver, thyroid, pancreas, spleen, intestine, prostate, uterus, ovary, breast, limbs, and eyes.

9. The system according to claim 4, wherein the tissue or organ is brain or kidney.

10. One or more non-transitory computer readable media storing computer executable code for instructing one or more processors for detecting arterial input function (AIF) in dynamic contrast enhanced magnetic resonance imaging (DCE-MRI) scans of a tissue or an organ in a subject, comprising:
 (a) a first processor for designing a mask to a major region of a scan imaging;

(b) a second processor for calculating a concentration of intravascular contrast agent Cp (t) by $$Cp(t) = k\Delta R_2^* = -\frac{1}{TE}\ln\frac{S(t)}{S(0)},$$

wherein t represents time; $\Delta R_2^*$ represents transverse relaxation at time t, S (t) is a signal intensity at time t, S (0) is a pre-injection baseline signal intensity, k is a scaling factor, wherein S (0) is the mean intensity of the time slot that the contrast agent arrives at the tissue;
(c) a third processor for calculating the area under the concentration curve;
(d) a fourth processor for discarding $P_{aus}$ percent of the curves with the smallest area, and $P_{aub}$ percent of the remaining curves with the biggest area;
(e) a fifth processor for determining peak values of every pixel in every scan image and excluding $P_{pks}$ percent of a pixel which peak value is smaller than a big peak value of all pixels in the imaging;
(f) a sixth processor for calculating a dissimilarity value between an AIF and a processed concentration time curve by $$dis_{ij} = \sqrt{(x_i - x_j)(x_i - x_j)'},$$

and selecting $P_{sim}$ percent of small dissimilarity values, wherein $x_i$ represents the processed concentration time curve and $x_j$ represents the AIF curve.
(g) a seventh processor for clustering concentration time curves using a fast-AP clustering algorithm, in which concentration time curves of remaining pixels are simultaneously considered as input data in the cluster analysis.

11. One or more non-transitory computer readable media according to claim 10 further storing computer executable code for selecting additional scans subjected to the process conducted by the first processor to the sixth processor.

12. One or more non-transitory computer readable media according to claim 10 further storing computer executable code for instructing a ninth processor for calculating a final value of AIF, which is a mean curve with the lowest first moment based on the selected scans.

13. One or more non-transitory computer readable media according to claim 10 further storing computer executable code for instructing a tenth processor for determining a blood flow of the tissue or organ based on the final value of AIF.

14. One or more non-transitory computer readable media according to claim 10, wherein the tissue or organ is selected from the group consisting of brain, kidney, lung, heart, liver, thyroid, pancreas, spleen, intestine, prostate, uterus, ovary, breast, limbs, and eyes.

* * * * *